(12) United States Patent
Wang et al.

(10) Patent No.: US 7,582,499 B2
(45) Date of Patent: Sep. 1, 2009

(54) PHOTO SENSOR AND A METHOD FOR MANUFACTURING THEREOF

(75) Inventors: Henry Wang, Hsinchu (TW); Wei-Chou Lan, Hsinchu (TW); Lee-Tyng Chen, Hsinchu (TW)

(73) Assignee: Prime View International Co., Ltd., Hsinchu (TW)

( * ) Notice: Subject to any disclaimer, the term of this patent is extended or adjusted under 35 U.S.C. 154(b) by 0 days.

(21) Appl. No.: 12/122,151

(22) Filed: May 16, 2008

(65) Prior Publication Data
US 2009/0085077 A1 Apr. 2, 2009

(30) Foreign Application Priority Data
Sep. 28, 2007 (TW) .............................. 96136414 A

(51) Int. Cl.
*H01L 21/00* (2006.01)
*H01L 21/8234* (2006.01)
*H01L 21/8222* (2006.01)

(52) U.S. Cl. ............... 438/48; 438/57; 438/58; 438/59; 438/60; 438/63; 438/65; 438/73; 438/237; 438/328; 257/E21.27; 257/E21.645; 257/E21.705

(58) Field of Classification Search ............ 257/E21.27, 257/E21.645, E21.705
See application file for complete search history.

(56) References Cited

U.S. PATENT DOCUMENTS

| | | | |
|---|---|---|---|
| 7,374,293 B2 * | 5/2008 | Li et al. ...................... 324/754 |
| 7,482,659 B2 * | 1/2009 | Hotta .......................... 257/355 |
| 2007/0093007 A1 * | 4/2007 | Deane ......................... 438/154 |
| 2008/0048295 A1 * | 2/2008 | Takahashi ................... 227/565 |

* cited by examiner

*Primary Examiner*—Charles D. Garber
*Assistant Examiner*—Mohsen Ahmadi
(74) *Attorney, Agent, or Firm*—Thomas, Kayden, Horstemeyer & Risley

(57) ABSTRACT

A photo sensor has an insulator layer for covering a diode stack, and the insulator layer is made of photoresist to reduce a side leakage current.

12 Claims, 7 Drawing Sheets

PHOTO SENSOR AND A METHOD FOR MANUFACTURING THEREOF

RELATED APPLICATIONS

This application claims priority to Taiwan Application Serial Number 96136414, filed Sep. 28, 2007, which is herein incorporated by reference.

BACKGROUND

1. Field of Invention

The present invention relates to a method of manufacturing a semiconductor device. More particularly, the present invention relates to a method of manufacturing a photo sensor.

2. Description of Related Art

A "Sensor" detects heat, light or magnetic fields and converts the detected physical parameter into electronic signals. By using the signal generated by the sensor, the user can obtain information therefrom.

According to the above, the data can be produced by a photo sensor that generates a current with light. The photo sensor can be divided into two parts, a transistor and a diode. The mechanism of the photo sensor is that the light is directed to the diode to generate a current, and then the current is amplified from tens to hundreds of times to produce a stronger signal.

However, in the conventional structure of the photo sensor, the material of the insulating layer used to cover the diode usually is silicon nitride, silicon oxide, or silicon oxy-nitride. Nevertheless, these materials cannot provide good insulation. In addition, since both sides of the diode are easily oxidized into silicon monoxide, the diode cover is degraded and current leakage from the diode through the insulating layer occurs. Furthermore, the conventional material for the insulating layer cannot provide good flatness. Therefore, there is a need to develop a photo sensor to prevent current leakage and to improve the electrical property of the photo sensor.

SUMMARY

The present invention provides a method of manufacturing a photo sensor to simplify the conventional process.

It is therefore an objective of the present invention to provide a method of manufacturing a photo sensor. First, a substrate having a switching element region and an electronic element region is provided. Next, a gate is formed on the switching element region of the substrate. A gate dielectric layer, a semiconductor layer, and an electrical property enhancement layer are formed in sequence to cover the gate and the substrate. After that, the electrical property enhancement layer and the semiconductor layer are patterned to form a channel region on the gate dielectric layer above the gate. Then, a first conductive layer, a plurality of element function layers and a second conductive layer are formed in sequence to cover the gate dielectric layer and the channel region. Next, the second conductive layer and the element function layers are patterned wherein the element function layers patterned form a diode stack on the first conductive layer of the electronic element region, and the second conductive layer patterned forms a photo-electrode on the diode stack. Furthermore, the first conductive layer is patterned to form a source/drain above the opposite sides of the channel region and expose a part of the electrical property enhancement layer. Then, an insulating layer is formed to cover the source/drain, the diode stack and the photoelectrode wherein the material of the insulating layer is a photoresist. The insulating layer is patterned to form an opening in the insulating layer and the opening exposes the photoelectrode. Moreover, a third conductive layer is formed to cover the insulating layer and the photoelectrode. Finally, the third conductive layer is patterned so that the third conductive layer patterned covers a part of the insulating layer above the source/drain and connects to one side of the photoelectrode near the source/drain along the opening.

It is another an objective of the present invention to provide a photo sensor having at least one switching element region and an electronic element region on a substrate. The photo sensor comprises a gate, a gate dielectric layer, a channel region, a source/drain, a diode stack, a photoelectrode, a insulating layer and a bias electrode. The gate is disposed on the switching element region of the substrate. The gate dielectric layer covers the gate and the substrate. The channel region is disposed on the gate dielectric layer above the gate. The source/drain is disposed on the opposite sides of the channel region and covers the gate dielectric layer underneath the opposite sides of the channel region. The diode stack is disposed on at least one of the source/drain in the electronic element region. The photoelectrode is disposed on the diode stack. The insulating layer covers the source/drain, the channel region, the diode stack and the photoelectrode, and has an opening to expose a part of the photoelectrode on the diode stack, wherein the material of the insulating layer is a photoresist. The bias electrode is disposed on a part of the insulating layer on the source/drain and connects to one side of the photoelectrode near the source/drain along the opening.

In the foregoing, compared with the conventional materials such as silicon nitride, silicon oxide or silicon oxynitride used for the insulating layer, the insulating layer made of resin has better insulating effect and less current leakage. Meanwhile, since the insulating layer made of resin can provide better flatness, the surface of the substrate becomes smoother and this is helpful for the later process.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
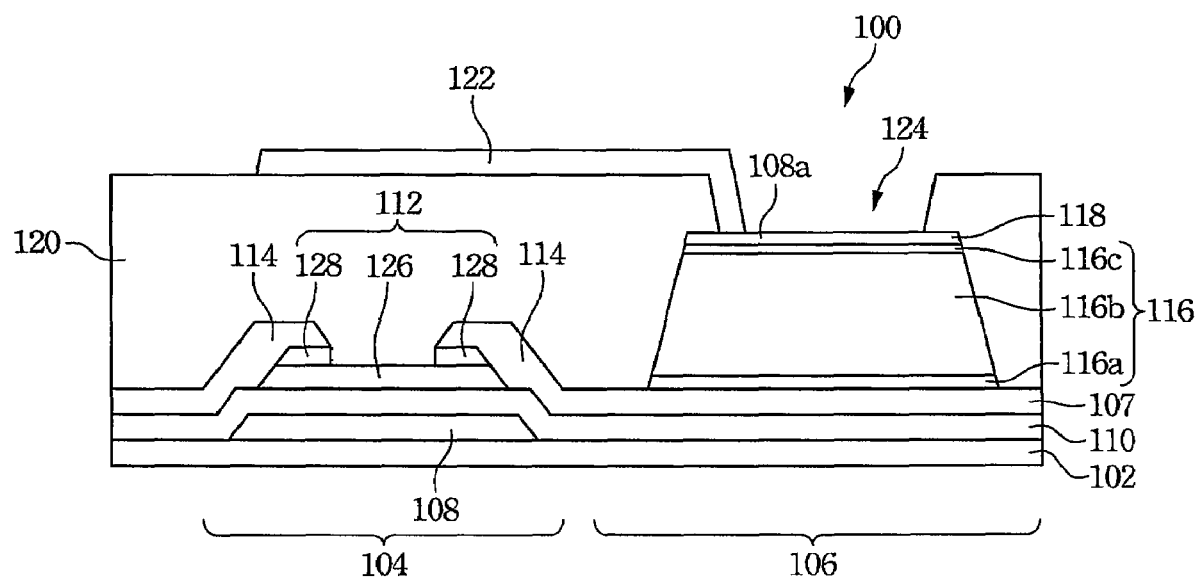
FIG. 1 is a cross section view of a photo sensor according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates a cross section view of a photo sensor according to one embodiment of the present invention. As show in FIG. 1, the photo sensor 100 is arranged on a substrate 102 which can be divided into a switching element region 102 and an electronic element region 104. The photo sensor 100 comprises a gate 108, a gate dielectric layer 110, a channel region 112, a source/drain 114, a diode stack 116, a photo electrode 118, a insulating layer 120 and a bias electrode 122. The gate 108 is disposed on the switching element region 104 of the substrate 102 and the gate dielectric layer 110 covers the gate 108 and the substrate 102. The channel region 112 is disposed on the gate dielectric layer 110 above the gate 108, and comprises a semiconductor layer 126 and an electrical property enhancement layer 128 disposed on both sides of the semiconductor layer 126. The source/drain 114 is disposed on the electrical property enhancement layer 128 of the channel region 112 and covers the gate dielectric layer 110 underneath the channel region 112.

A diode stack 116 is arranged on one of the source/drain 114 in the electronic element region 106 of the substrate 102 and the photoelectrode 118 is disposed on the diode stack 116. The insulating layer 120 covers the source/drain 114, the channel region 112, the diode stack 116 and both sides of the photoelectrode 118, and has a opening 124 to expose a part of the photoelectrode 118 on the diode stack 116. The bias electrode 122 is disposed on a part of the insulating layer 120 on the source/drain 114 and connects to one side 118a of the photoelectrode 118 near the source/drain 114 along the opening 124.

Figure 2A:
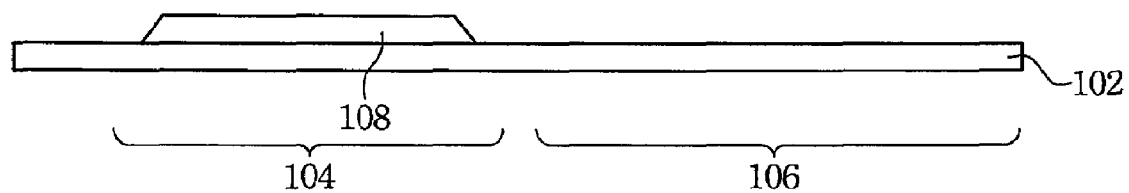
FIGS. 2A-2J illustrate cross section views of the photo sensor of FIG. 1 at each manufacturing stage.

Next, FIG. 2A to FIG. 2J illustrate cross section views of the photo sensor 100 of FIG. 1 described above at each manufacturing stage. As shown in FIG. 2A, a substrate 102 is provided first, wherein the substrate 102 has a switching element region 104 and an electronic element region 106. Next, a gate metal layer (not shown) is formed on the substrate and then patterned to form a gate 108 on the switching element region 104 of the substrate 108. The substrate 102 is a transparent substrate, such as a glass substrate or a plastic substrate. The method used to form the gate metal layer can be physical vapor deposition, and the material used can be for example Mo, Cr, an alloy of Mo and Cr, an alloy of Mo and W, the complex material of Mo—Al—Mo or the complex material of Cr—Al—Cr. The thickness of the gate metal layer is between 2000 Å and 4000 Å.

Figure 2B:
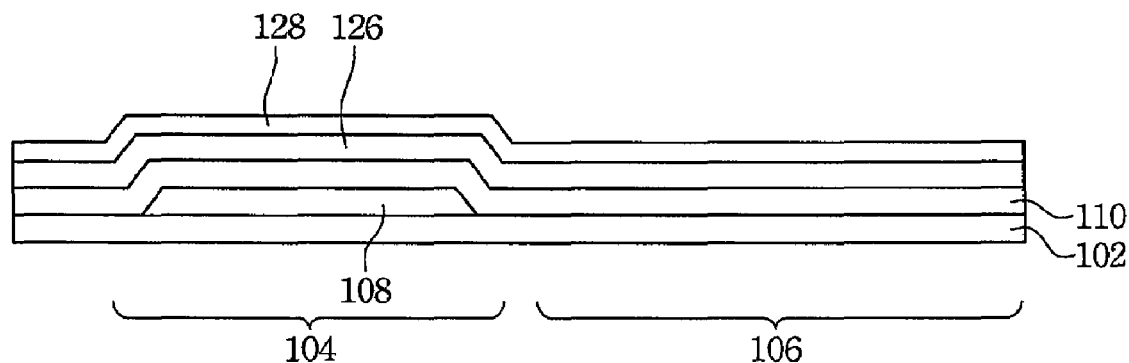

Refer to FIG. 2B, a gate dielectric layer 110, a semiconductor layer 126, and an electrical property enhancement layer 128 are formed in sequence on the gate 108 and the substrate 102. The method used to form these three layers can be chemical vapor deposition wherein the thickness of the gate dielectric layer is between 2500 Å and 4000 Å and is made of silicon nitride. The thickness of the semiconductor layer 126 is between 4000 Å and 1500 Å and the material thereof is amorphous silicon. The thickness of the electrical property enhancement layer 128 is between 1000 Å and 100 Å and the material is doped silicon.

Figure 2C:
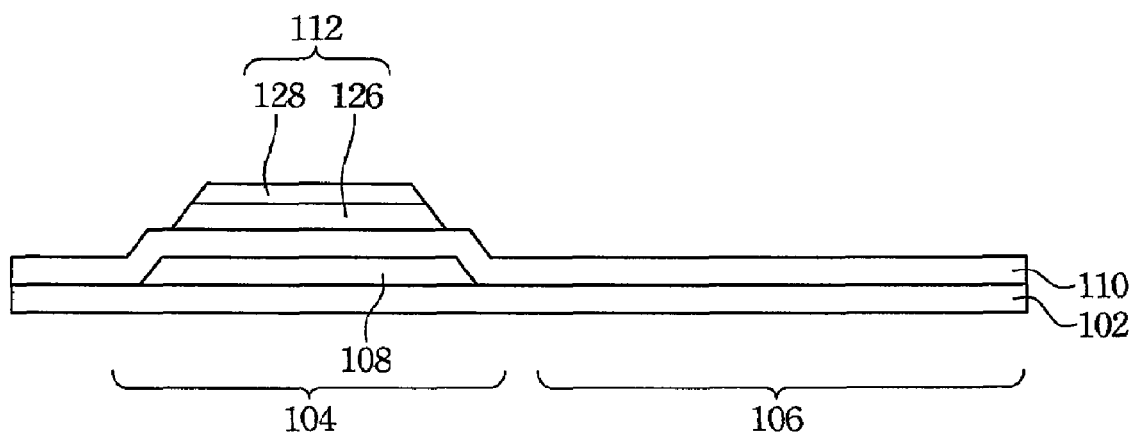

Refer to FIG. 2C, the electrical property enhancement layer 128 and the semiconductor layer 126 are patterned to form a channel region 112 on the gate dielectric layer 110 above the gate 108.

Figure 2D:
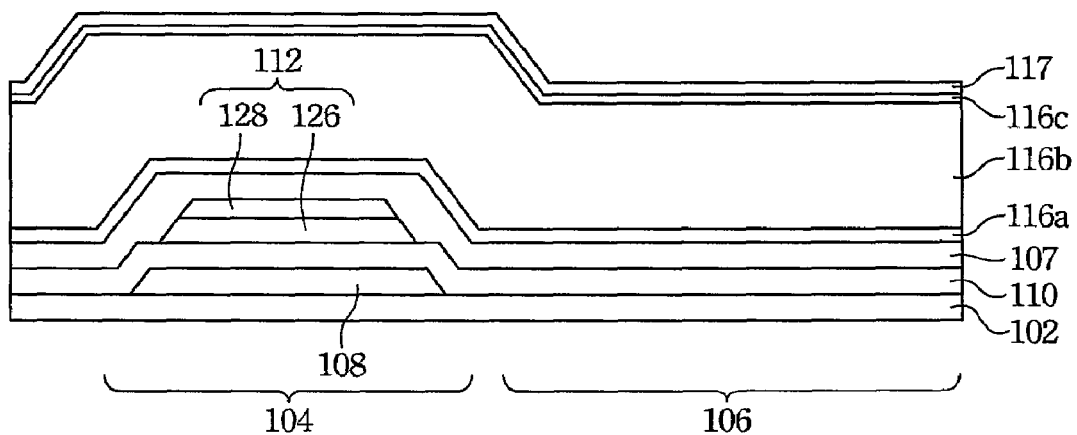

After that, Refer to FIG. 2D, a first conductive layer 107, a plurality of element function layers 116a, 116b, 116c and a second conductive layer 117 are formed in sequence on the gate dielectric layer 110 and the channel region 112. The element function layers 116a, 116b and 116c are a first doping layer, an intrinsic semiconductor layer, and a second doping layer, respectively. In the embodiment, the method used to form the element function layers 116a, 116b and 116c can be chemical vapor deposition. The element function layer 116a is an n-doped silicon layer with thickness between 250 Å and 500 Å. The element function layer 116b layer is an amorphous silicon layer with thickness between 4500 Å and 8000 Å. The element function layer 116c layer is a p-doped silicon layer with thickness between 110 Å and 200 Å. However, in the embodiment, the element function layers 116a and 116c are used as exemplified, which can also be p-doped silicon layer and n-doped silicon layer, respectively. The first conductive layer 107 and the second conductive layer 117 can be formed by physical vapor deposition wherein the first conductive layer 107 can be metal, such as copper or the alloy thereof, with thickness between 2000 Å and 4000 Å. The second conductive layer 117 is made of a transparent material, such as indium tin oxide, aluminum zinc oxide, indium zinc oxide, cadmium zinc oxide or the combination thereof, with thickness between 300 Å and 500 Å. In the following process described, the first conductive layer 107 and the element function layer 116a-116c will further form a source/drain and a diode stack, respectively.

Figure 2E:
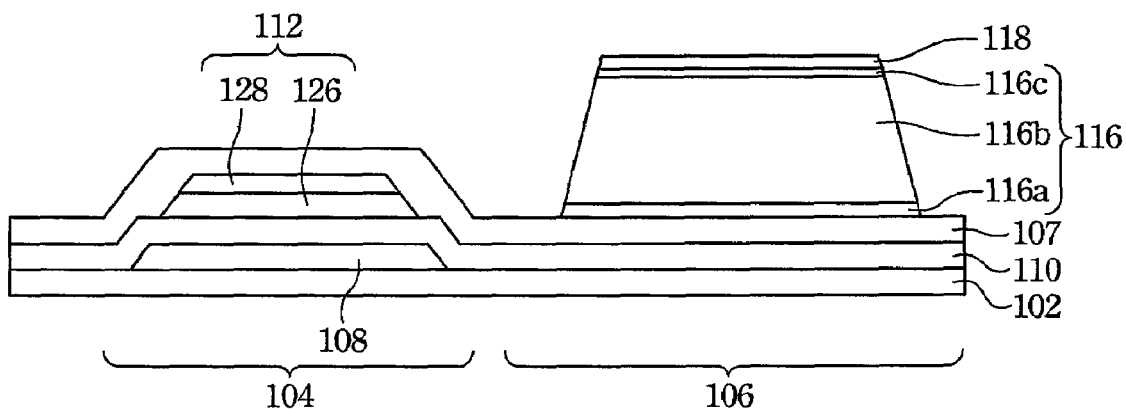

Refer to FIG. 2E, the second conductive layer 117 and the element function layers 116a-116c are patterned so that the element function layers 116a-116c turns into a diode stack 116 on the first conductive layer 107 of the electronic element region 106, and the second conductive layer 117 becomes a photoelectrode 118 on the diode stack 116. Since the photo electrode 118 is made of transparent material, light can directly pass through the photo electrode 118 and then to the diode stack 116 to generate a current, while using the photo sensor 110. In addition, according to the materials used for the element function layers 116a-116c, it is known that the diode 116 is a PIN diode wherein an amorphous silicon layer is arranged between a p-doped silicon layer and a n-doped silicon layer so that the enlarged depletion region can generate a greater current after being illuminated.

Figure 2F:
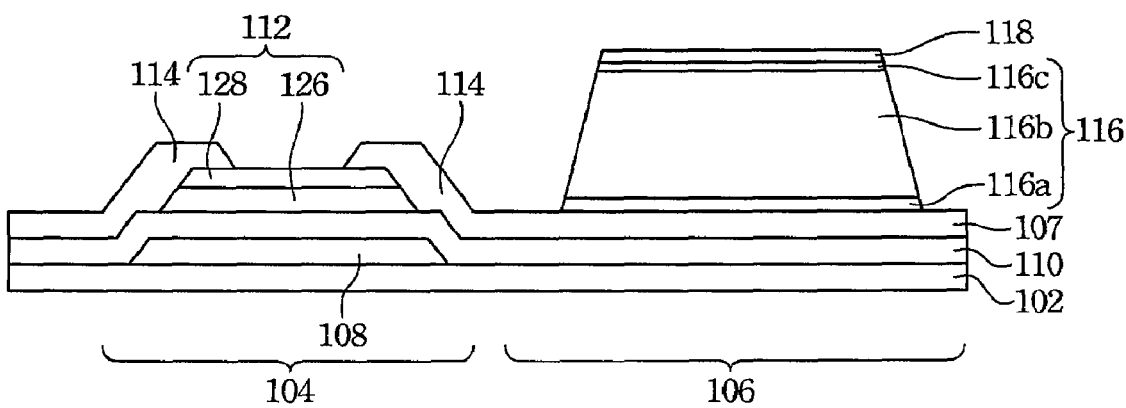

Refer to FIG. 2F, the first conductive layer 107 is patterned to form a source/drain 114 above the opposite sides of the channel region 112 and expose a part of the electrical property enhancement layer 128. The electrical property enhancement layer 128 in the channel region 112 reduces the resistance between the semiconductor layer 126 and the source/drain and 114 to enhance the Ohmic Contact property. The Ohmic Contact property is that the contact resistance between two different materials is small and steady, which will not change as the voltage is changed. Since there is a difference between the energy level of the amorphous silicon material used for the semiconductor layer 126 and that of the metal used for the source/drain 114, this results in increasing the resistance. Therefore, by arranging a high doped electrical property enhancement layer 128 between the semiconductor layer 126 and the source/drain 114, electrons can flow between the metal and the semiconductor material much more easily so that the Ohmic Contact property can be improved. Similarly, in the embodiment of the present invention, the Ohmic Contact property between the element function layer 116b and the first conductive layer 107, and between the element function layer 116b and the photoelectrode 118 can be improved by the element function layers 116a (an n-doped silicon layer) and the element function layers 116c (a p-doped silicon layer), respectively.

Figure 2G:
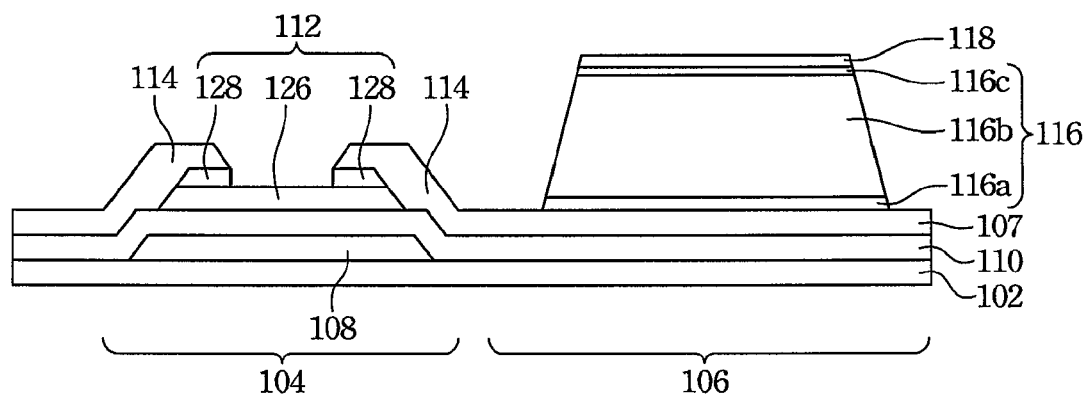

Refer to FIG. 2G, after patterning the first conductive layer 107 is completed, the electrical property enhancement layer 128 is selectively etched to expose a part of the semiconductor layer 126.

Figure 2H:
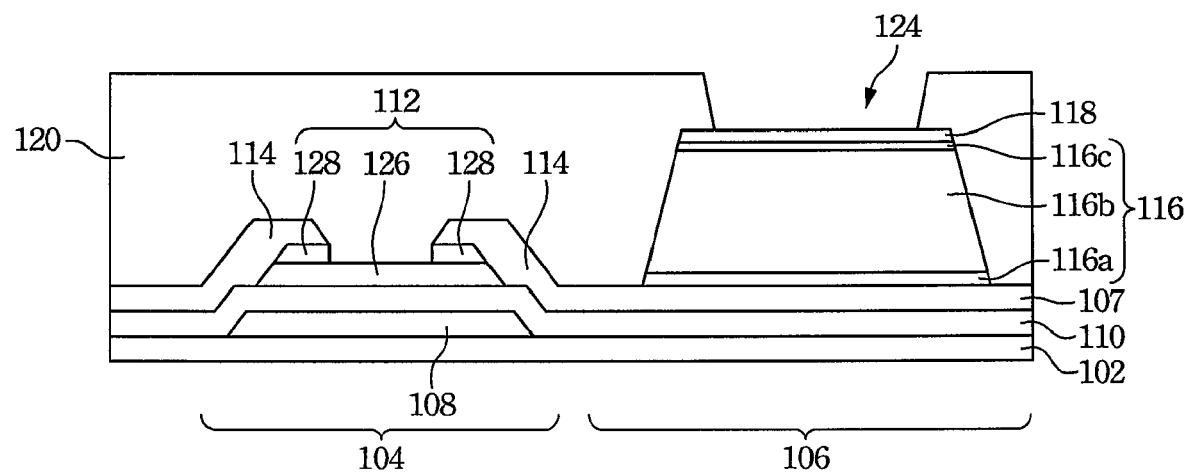

Next, refer to FIG. 2H, an insulating layer 120 is formed to cover the source/drain 114, the channel region 112, the diode stack 116 and the photoelectrode 118. After that, the insulating layer 120 is patterned to form an opening 124 in the insulating layer 120 so that a part of the photoelectrode 118 is exposed. In the embodiment, the thickness of the insulating layer 120 is between 0.5 μm and ~1.6 μm and can be made of common photoresists, such as phenolic resin, or black matrix photoresist (e.g., the photoresist comprises epoxy resin (Novolac), acrylic resin, etc.). Compared with the conventional material used, such as silicon nitride, silicon oxide, or silicon oxynitride, in this embodiment, the insulating layer 120 made of resin not only provides good impedance ability but also forms better coverage on the side of the diode stack 116 so that the generation of the leakage current can be decreased.

Figure 2I:
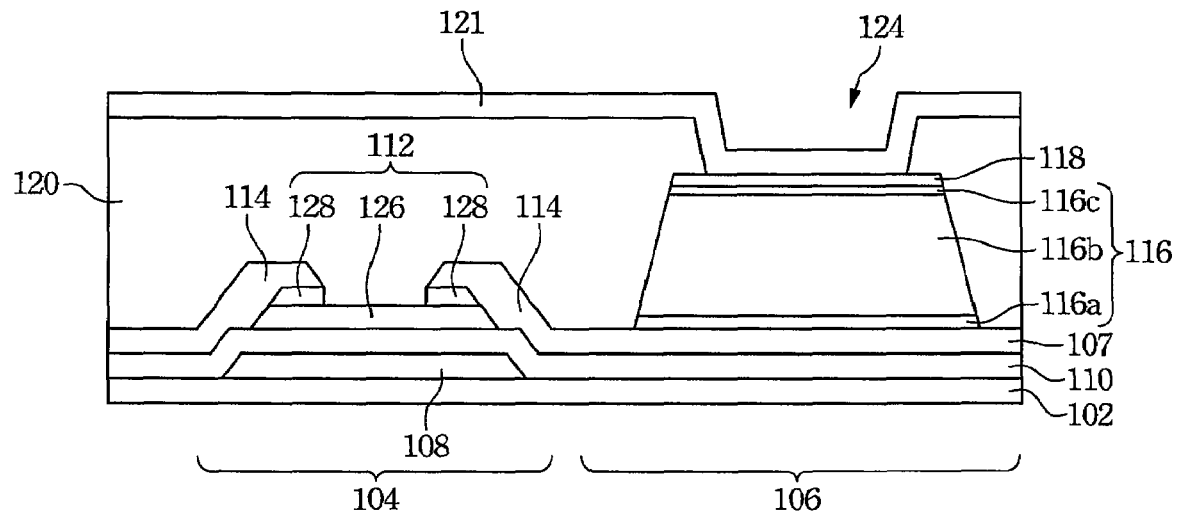

Refer to FIG. 2I, the third conductive layer 121 is formed on the second conductive layer 117 in the opening 124 and the insulating layer 120. The thickness of the third conductive layer 121 is between 2000 Å and 4000 Å and the material used is metal, such as copper.

Figure 2J:
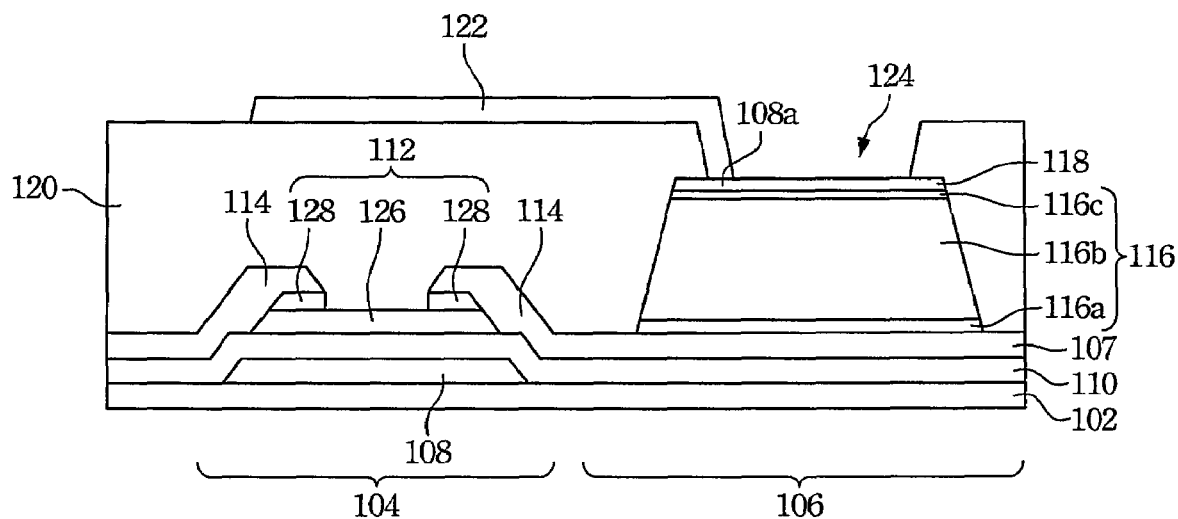

Refer to FIG. 2J, the third conductive layer 121 is patterned so that the third conductive layer 121 patterned forms a bias electrode 122. As shown in FIG. 2J, the bias electrode 122 covers a part of the insulating layer 120 above the source/drain 114 and connects to one side 118a of the photoelectrode 118 near the source/drain 114 along the opening 124. The bias electrode 122 not only provides a bias voltage for the diode stack 126, but also is an effective shield against the light.

Figure 3:
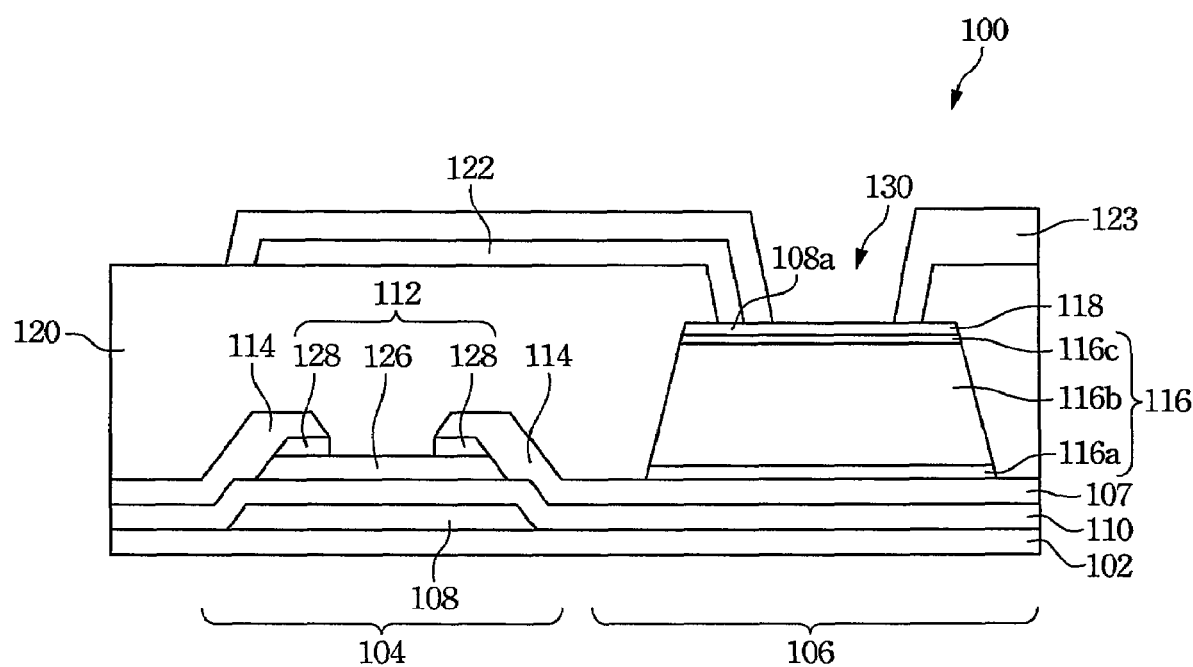
FIG. 3 illustrates a cross section view of the photo sensor having a protective layer according to another embodiment of the present invention.

Furthermore, refer to FIG. 3. FIG. 3 illustrates a cross section view of the photo sensor 100 according to another embodiment of the present invention. In the embodiment, to provide sufficient protection for the photo sensor 100, a protective layer 123 is formed to cover the insulating layer 120, the bias electrode 122 and the photoelectrode 118. Then, the protective layer 123 is patterned so that the protective layer 123 patterned covers the bias electrode 122 and the insulating layer 120 in the electronic element region 106, and a lighting opening 130 is formed above the diode stack 116 to expose a part of the photoelectrode 118. In the embodiment, the material used for the protective layer 123 depends on the insulating layer 120. For example, while the material used for the insulating layer 120 is resin type black matrix photoresist having light shielding function, the protective layer 123 can be made of common photoresist without light shielding function or resin type black matrix photoresist with light shielding function. While the material of the insulating layer 120 is common photoresit without light shielding function, the material used for the protective layer 123 needs to be made of resin type black matrix photoresist with light shielding function to provide better light shield effect.

To examine whether the photo sensor manufactured by the process above could prevent the leakage current or not, a bias voltage is applied to three kinds of PIN diodes to test the leakage of the current. These three kinds of PIN diodes tested are: (1) PIN diode without an insulating layer; (2) PIN diode with a conventional silicon nitride insulating layer; and (3) PIN diode with a epoxy resin insulating layer. The result is shown in FIG. 4.

Figure 4:
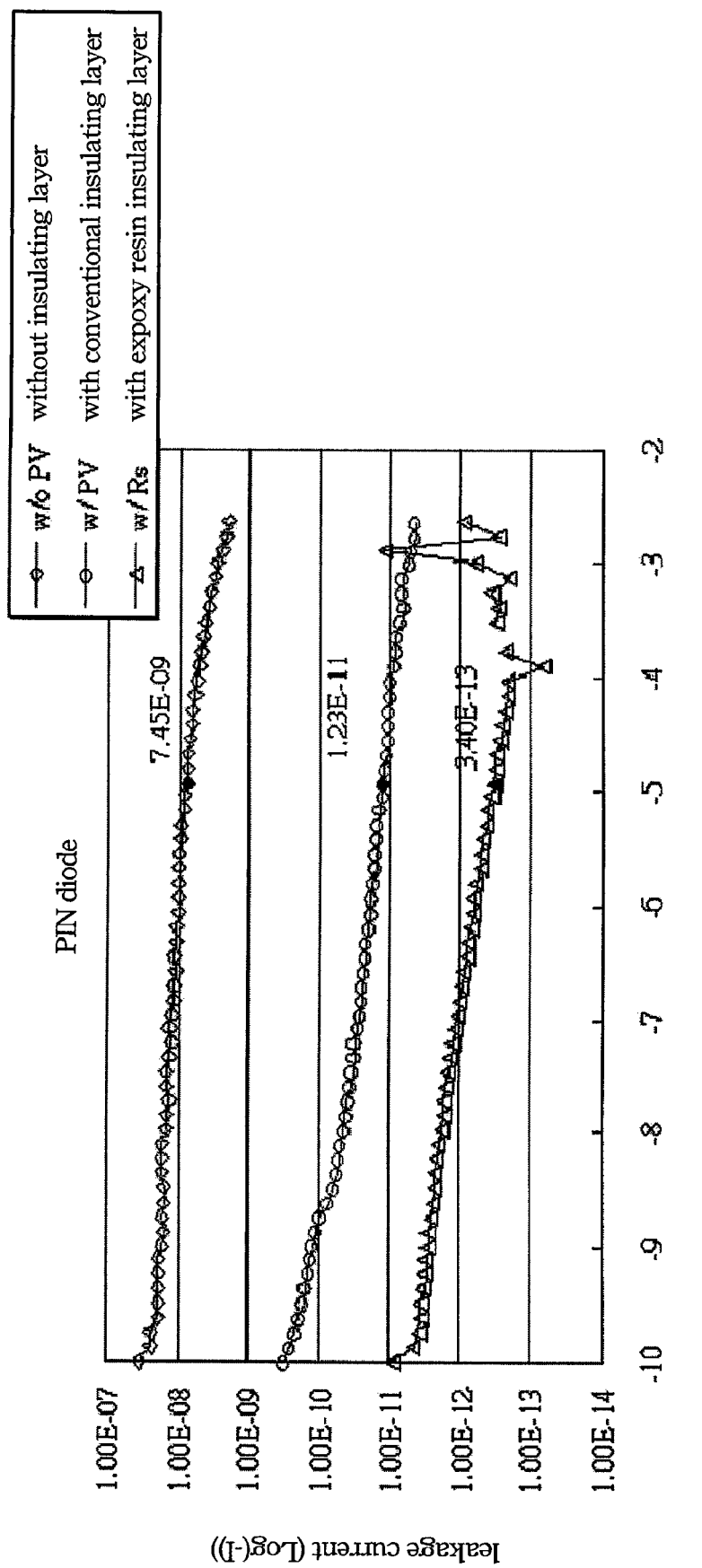
FIG. 4 illustrates the results of the current leakage test for three different diodes.

Refer to FIG. 4. FIG. 4 illustrates the results of the current leakage test for three different diodes. As shown in FIG. 4, the PIN diode without an insulating layer has the greatest leakage current, which is $7.45 \times 10^{-9}$ per unit area (500 μm×500 μm). The conventional PIN diode with a silicon nitride insulating layer has a less leakage current, $1.23 \times 10^{-11}$ per unit area. As to the PIN diode with an epoxy resin insulating layer, it has the fewest leakage current, only $3.4 \times 10^{-13}$, which is decreased at least 40% compared with that of the conventional diode.

According to above, compared with the conventional materials such as silicon nitride, silicon oxide or silicon oxynitride used for the insulating layer, the insulating layer made of resin has better insulating effect so that the leakage current can be reduced. Meanwhile, since the insulating layer made of resin can provide better flatness than other materials (e.g., silicon nitride), the surface of the substrate will become smoother and this is helpful for the later process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing photo sensor, comprising:
    providing a substrate having a switching element region and an electronic element region;
    forming a gate on the switching element region of the substrate;
    forming a gate dielectric layer, a semiconductor layer, and an electrical property enhancement layer in sequence to cover the gate and the substrate;
    patterning the electrical property enhancement layer and the semiconductor layer to form a channel region on the gate dielectric layer above the gate;
    forming a first conductive layer, a plurality of element function layers and a second conductive layer in sequence to cover the gate dielectric layer and the channel region;
    patterning the second conductive layer and the element function layers wherein the element function layers patterned form a diode stack on the first conductive layer of the electronic element region, and the second conductive layer patterned forms a photoelectrode on the diode stack;
    patterning the first conductive layer to form a source/drain above the opposite sides of the channel region and expose a part of the electrical property enhancement layer;
    forming a insulating layer to cover the source/drain, the diode stack and the photoelectrode wherein the material of the insulating layer is a photoresist;
    patterning the insulating layer to form an opening in the insulating layer and the opening exposes the photoelectrode;
    forming a third conductive layer to cover the insulating layer and the photoelectrode; and
    patterning the third conductive layer so that the third conductive layer patterned covers a part of the insulating layer above the source/drain and connects to one side of the photoelectrode near the source/drain along the opening.

2. The method of claim 1, wherein the photoresist is resin type black matrix photoresist.

3. The method of claim 1, wherein the photoresist is phenolic resin, epoxy resin, or acrylic resin.

4. The method of claim 1, wherein the thickness of the insulating layer is at least 0.5 μm.

5. The method of claim 1, wherein the thickness of the insulating layer is 0.5-1.6 μm.

6. The method of claim 1, further comprising forming a protective layer to cover the insulating layer, the third conductive layer and the photoelectrode after patterning the third conductive layer.

7. The method of claim 6, further comprising patterning the protective layer so that the protective layer patterned covers the third conductive layer and a lighting opening is formed above the diode stack to expose a part of the photoelectrode.

8. The method of claim 1, wherein the element function layers comprise a first doping layer, an intrinsic semiconductor layer, and a second doping layer.

9. The method of claim 8, wherein the first doping layer is an n-doped silicon layer and the second doping layer is a p-doped silicon layer.

10. The method of claim 8, wherein the intrinsic semiconductor layer is an amorphous silicon layer.

11. The method of claim 1, wherein the electrical property enhancement layer is an n-doped silicon layer.

12. The method of claim 1, further comprising etching the electrical property enhancement layer to expose a part of the semiconductor layer after patterning the first conductive layer and prior to forming the insulating layer.

* * * * *